(12) United States Patent
Mei et al.

(10) Patent No.: US 9,406,896 B2
(45) Date of Patent: Aug. 2, 2016

(54) PRE-FABRICATED SUBSTRATE FOR PRINTED ELECTRONIC DEVICES

(71) Applicant: Palo Alto Research Center Incorporated, Palo Alto, CA (US)

(72) Inventors: Ping Mei, San Jose, CA (US); Janos Veres, San Jose, CA (US); Tse Nga Ng, Sunnyvale, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 179 days.

(21) Appl. No.: 14/152,183

(22) Filed: Jan. 10, 2014

(65) Prior Publication Data

US 2015/0200376 A1 Jul. 16, 2015

(51) Int. Cl.
*H01L 29/66* (2006.01)
*H01L 51/05* (2006.01)
*H01L 51/10* (2006.01)
*H01L 51/00* (2006.01)

(52) U.S. Cl.
CPC .......... *H01L 51/0541* (2013.01); *H01L 51/102* (2013.01); *H01L 51/0004* (2013.01)

(58) Field of Classification Search
CPC ............ H01L 51/0541; H01L 51/0004; H01L 2924/0002; H01L 2224/48091; H01L 51/102; H01L 2924/00014; H01L 2924/00

USPC ............................................. 257/657, E29.12
See application file for complete search history.

(56) References Cited

U.S. PATENT DOCUMENTS

| 5,834,802 | A | * | 11/1998 | Takahashi | H01L 21/28587 257/270 |
| 5,920,486 | A | * | 7/1999 | Beahm | G06F 17/5068 257/E27.062 |
| 2002/0005545 | A1 | * | 1/2002 | Widdershoven | H01L 27/11568 257/314 |
| 2005/0071969 | A1 | * | 4/2005 | Sirringhaus | B82Y 30/00 29/4.51 |
| 2005/0173701 | A1 | * | 8/2005 | Kawase | H01L 51/0022 257/40 |
| 2008/0001176 | A1 | * | 1/2008 | Gopalakrishnan | B82Y 10/00 257/211 |
| 2008/0272361 | A1 | * | 11/2008 | Lim | B82Y 10/00 257/9 |
| 2010/0264403 | A1 | * | 10/2010 | Sirringhaus | B82Y 10/00 257/24 |
| 2013/0175631 | A1 | * | 7/2013 | Behrends | H01L 21/28123 257/368 |

* cited by examiner

*Primary Examiner* — Yosef Gebreyesus
(74) *Attorney, Agent, or Firm* — Marger Johnson

(57) ABSTRACT

A pre-patterned substrate has a supporting material, a plurality of segments on the supporting material, a plurality of interdigitated line structures within each segment to allow formation of features, and an isolation region between the segments.

18 Claims, 8 Drawing Sheets

PRE-FABRICATED SUBSTRATE FOR PRINTED ELECTRONIC DEVICES

BACKGROUND

Solution based all-additive printing process enables low cost fabrication of electronic devices on a large area flexible substrate. These printing processes offer several advantages, including fast prototyping with on-demand custom device, patterning devices at low temperature, and applies to a broad range of applications for electronic device manufacture.

Demand continues to drive improvements to fabricate faster, smaller and lower cost devices with higher integrated circuit density. Many of these printing processes use organic semiconductors. Organic thin-film transistors (OTFT) have low electron or hole mobility. Because of this low mobility, the desired device performance requires a large ratio of the TFT channel width to channel length (W/L).

FIG. 1 shows an example of an inverter 10 manufactured from current ink jetting techniques. Conventional ink jetting technology produces a line 12 having a minimum line width of about 60 micrometers for channel 14, with the minimum channel length being about 30 micrometers. The large W/L ratio is realized by a large channel width of about 2 millimeters for the TFT channel, resulting in a W/L ratio of approximately 67 (2000/30). The resulting circuit size therefore has a larger than desirable size.

The transistor current in the linear or saturation region is proportional to the W/L ratio or the square of the W/L ratio, minimizing the channel length allows for higher currents. In addition to the challenge of minimizing the channel length, the wide width of the conductive lines or traces causes a large area of the overlap between source/drain (11/12) and gate 16 of the transistor made by a conventional jetting technique. In one embodiment, the overall area is approximately $9 \times 10^4$ micrometers$^2$. Minimizing the overlap area will result in reducing the overlap parasitic capacitance and improving the device speed.

DETAILED DESCRIPTION OF THE EMBODIMENTS

Figure 2:
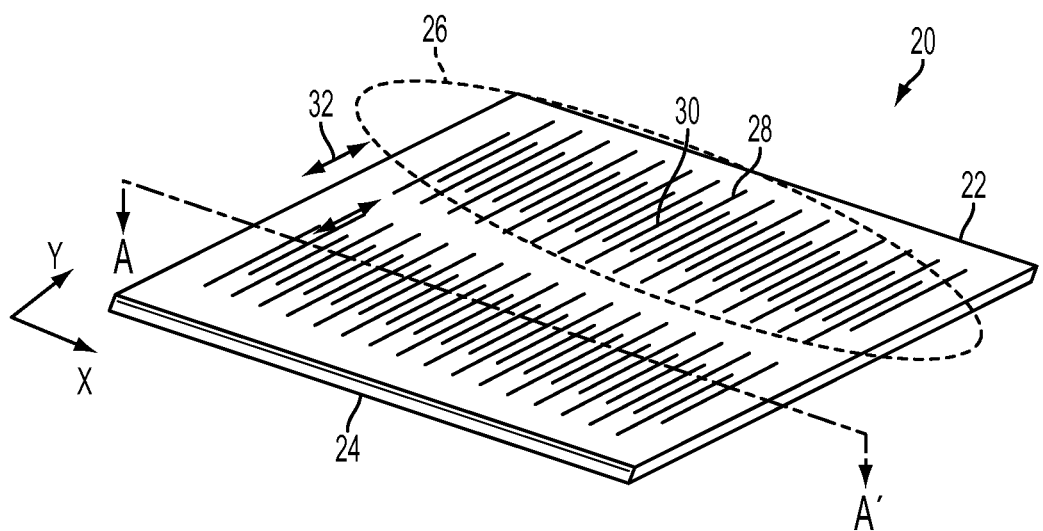
FIG. 2 shows an embodiment of a pre-patterned circuit substrate.

FIG. 2 shows an embodiment of a pre-patterned or pre-fabricated substrate usable for printing electronic devices. The substrate enables an additive printing process to produce desired devices and circuit patterns with critical dimensions much smaller than the limitations of conventional printing process. The generically designed pre-patterned substrate comprises of periodic segments of repetitive patterns of inter-digitated line structures in micrometer or nanometer scale. The process utilizes these patterns to form transistor channels by printing semiconductor inks over the fine features without a critical alignment with the substrate. The printing layout design determines the location of a thin film transistor (TFT) and the channel width.

The term 'channel length' is the distance between the source and the drain. The parallel lines are staggered such that they extend out at each end to allow for contact. The extension length may range from a few micrometers to a few hundred micrometers. As will be seen later, the alternating lines each form a source contact at one end and a drain contact at the other. The distance between these alternating lines in the X direction makes up the channel length.

The 'channel width' is defined as the sum of each channel width inside an area of semiconductor ink, running in the y direction. The number of the channels will be determined by conductive patterns formed by a subsequent jetting process that bundles some of the lines. As will be seen in further embodiments, the dimension of these channels may vary in the y direction and several channels will typically be included inside the area of the ink drop(s).

In the embodiment of FIG. 2, the substrate 20 may consist of a supporting material 24 such as various types of plastics, glass substrates, silicon wafers or steel foils. The substrate may optionally include an insulating buffer layer such as 22. A series of segments such as 26 includes a set of pre-patterned lines such as 28 and 30. The lines may consist of conductive materials such as silver, gold, platinum, or aluminum. As mentioned above, the interdigitated lines 28 and 30 are staggered such that the contacts for the lines staggered with 28 are to one side of the segment, and the contacts for the lines staggered with 30 are to the other side of the segment. An isolation region resides between the segments to allow the contacts for the lines to be printed. The dimension of the isolation region in the Y direction may range from a few tens of micrometers to a few millimeters.

Figure 3:
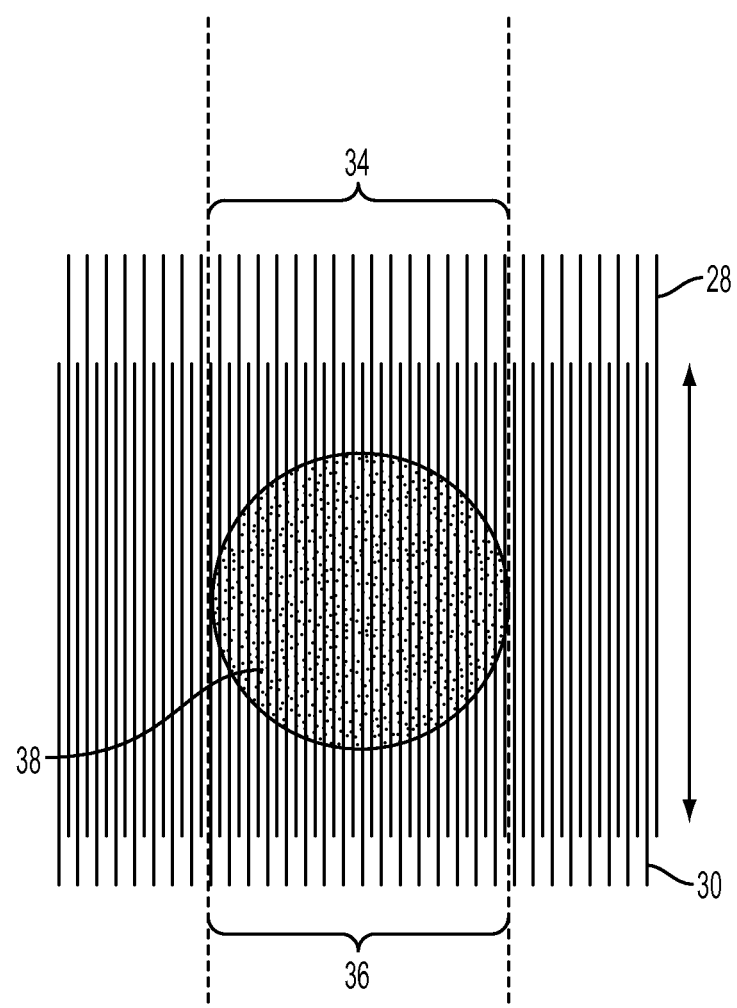
FIG. 3 shows a planar view of staggered parallel lines on a pre-patterned substrate.

FIG. 3 shows a more detail view of one segment having a semiconductor ink drop 38 that forms a thin film transistor according to one embodiment. In general, multiple overlapping ink drops may be used to form a semiconductor region for the transistor. The source contacts 34 and the drain contacts 36 are bundled into one thin film transistor. The source contacts 34 consist of those lines that are staggered with line 28, the drain contacts consist of those lines that are staggered with line 30. The spacing between each staggered line, which comprises the channel length, may range from a few nanometers to tens of micrometers, such as from 1 nanometer to 10 micrometers. In the example of FIG. 3, the channel length is 5 micrometers. The line width may range from a few nanometers to hundreds of micrometers, such as from 1 nanometer to 100 micrometers. The type of conducting material use and the requirement of the conductance for a given current and voltage determines the line width. For example, for a silver line of 500 micrometer in length, 3 micrometers wide and 200 nanometers thick, the resistance is about 13 ohms. This is sufficient for loading 1 milliamp current under 5 volts of source-drain voltage.

In FIG. 3, the dimension of the segment and staggered region is slightly larger than the drop size of the semiconductor pattern. The jetting size of one embodiment of current p-type organic semiconductor has a diameter of about 250 micrometers, and the segment has a dimension of about 400 micrometers. In this embodiment, the drop covers about 30 channels in the circular area. Each channel has a different channel width which is in the y direction. In this particular embodiment, the total channel width is about 6 millimeters. This particular segment has the spacing between the source lines and the drain lines of 5 micrometers and the line width is 3 um. This results in one drop having the maximum W/L ratio of 1200, (6000/5). This method creates a circuit having more than 10 times the W/L ratio compared with the printed source-drain approach. The resulting circuit can handle currents more than 10 times than previous circuits in the linear transistor operation condition.

In addition to the advantage of reducing the TFT channel length, the overlap capacitance between the source-drain and the gate electrode is also reduced due to the narrow line width of the pre-patterned feature. For a line width of 3 micrometers, the overlap area reduces by about 20 times, when compared with 60 micrometers wide traces made by convention ink printing. This reduction further improves the circuit performance.

Figure 1:
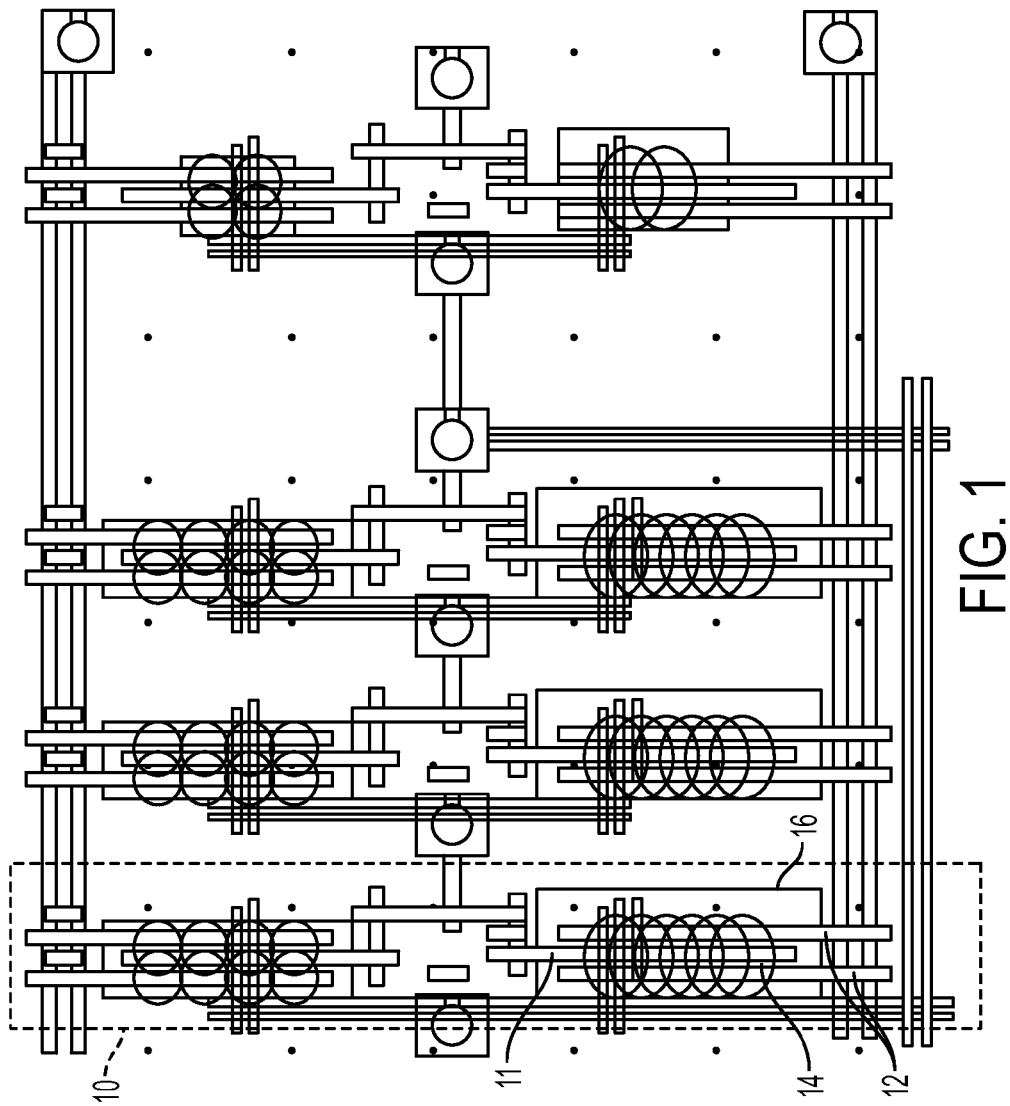
FIG. 1 shows a prior art embodiment of a printed electronic circuit.
Figure 4:
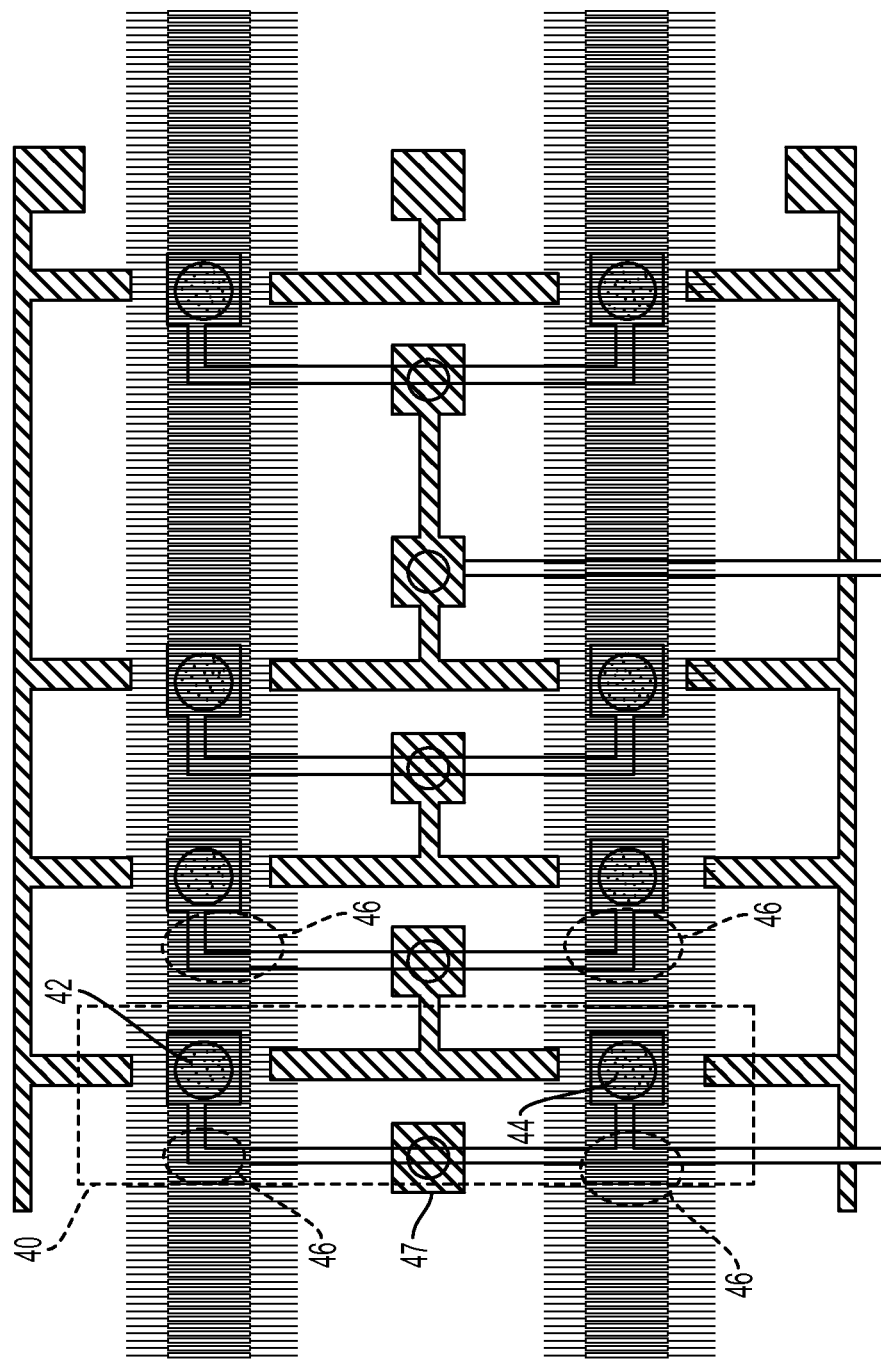
FIG. 4 shows an embodiment of an electronic device manufactured on a pre-patterned substrate.

FIG. 4 shows an application of making a clock circuit by ink jet printing processes on the universally pre-patterned substrate. Patterns of source-drain connection traces are formed by silver ink jetting on the substrate (in gray). These patterns not only serve as connections between organic TFTs at the lower source-drain level, but also define the TFT channel location and channel width by bundling some of the leads on both sides of a segment. The length of the leads has a range of a few micrometers to a few hundred micrometers, large enough to allow tolerance of printing resolution for the ink jet to place the conductive traces to connect the number of leads. In this example, p-type TFTs are formed from p-type ink such as 42 shown at the top of the circuit and n-type TFTs reside on the bottom formed from n-type ink such as 44. The inverter 40 compares to that in FIG. 1. The isolation regions between the segments allow printing of the conductive traces to connect various TFT source and drain contacts. The rest of the processes include gate dielectric coating, via formation for vertical interconnection, and gate level patterning are similar to our current conventional processes.

As shown in FIG. 4, the gate of transistor 42 and 44 are connected through area 46. Since these parallel lines in the segment are isolated when they are not bundled, the gate lines passing through this area do not overlap with the source drain electrode and therefore do not contribute to the overlap parasitic capacitance. The via 47 allows for source/drain bottom metal to the gate top metal connection. Wherever the area where the lines are not bundled can be used for various connections which make the universally patterned substrate reconfigurable for various types of circuits. If required, these areas can be used for vertical or lateral metal connections.

Figure 5:
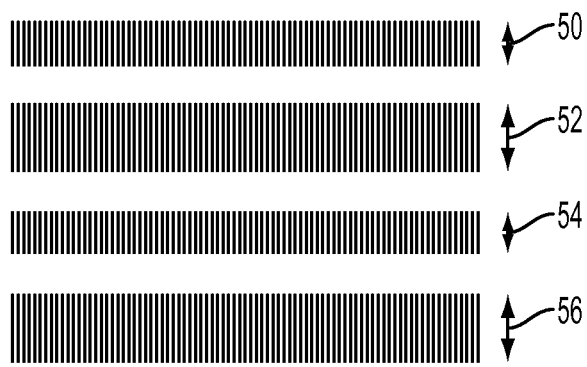
FIG. 5-7 show embodiments of variations of parallel line structures on a pre-patterned substrate.
Figure 6:
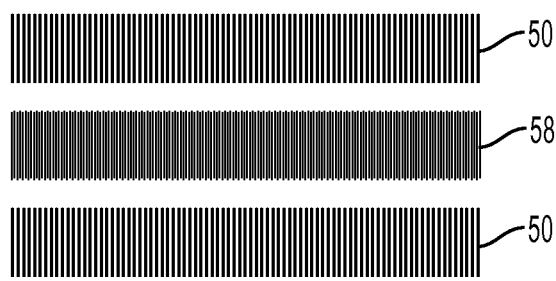
Figure 7:
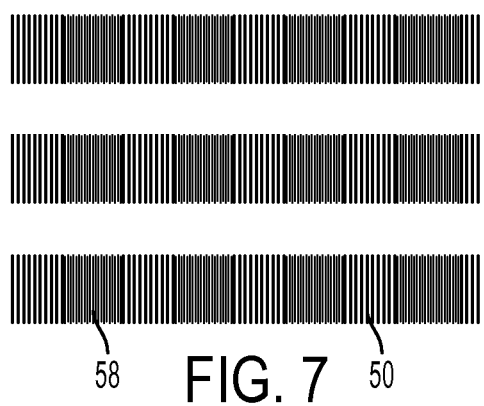

Many modifications and variations exist for the embodiments disclosed here. FIGS. 5 through 7 show possible variations in the segments. The length of a segment may differ from its neighboring segment as shown by segments 50, 52, 54 and 56. In addition, the line spacing, which defines the channel length, may vary from segment to segment. As shown in FIG. 6, the segments 50 have one line spacing and the segment 58 has a tighter spacing. In one embodiment the segments 50 have spacing of 5 micrometers and segment 58 has a spacing of 3 micrometers. FIG. 7 shows a spacing variation between segment 50 spacing and segment 58 spacing, but within one segment.

Other variations include different conducting materials or treatments, or varying line lengths corresponding to channel widths. The width of the sub-segment is also determined by the width of the coverage of ink drops, which can also be controlled to provide more flexibility.

Figure 8:
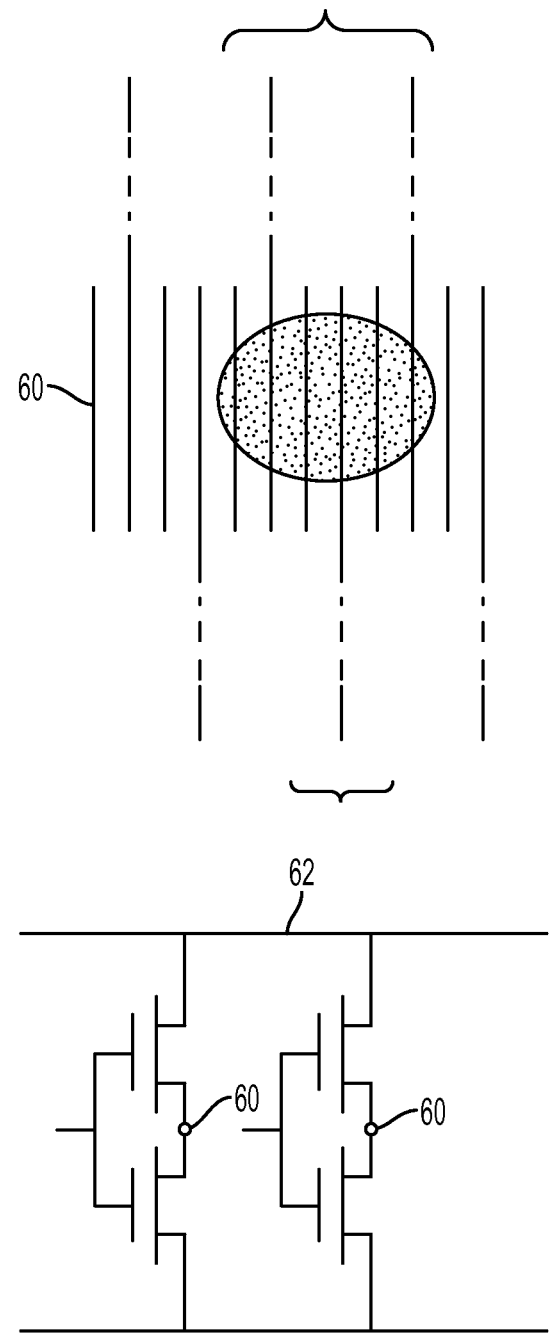
FIG. 8 shows an embodiment of a parallel line structure having floating lines and an equivalent circuit.

In another embodiment, the patterns may include floating lines inserted between each pair of staggered lines, shown in FIG. 8. The floating line such as 60 may reside between the source and drain lines of each pair. This may allow multiple TFTs to be connected serially. It may also reduce the source-drain leakage current. FIG. 8 also shows the equivalent circuit 62.

Figure 9:
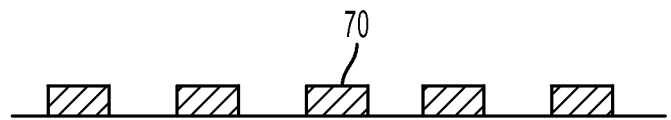
FIGS. 9-11 show embodiments of pre-patterned line structures on a substrate.
Figure 10:
Figure 11:
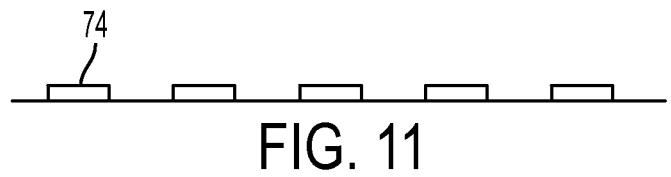
Figure 12:
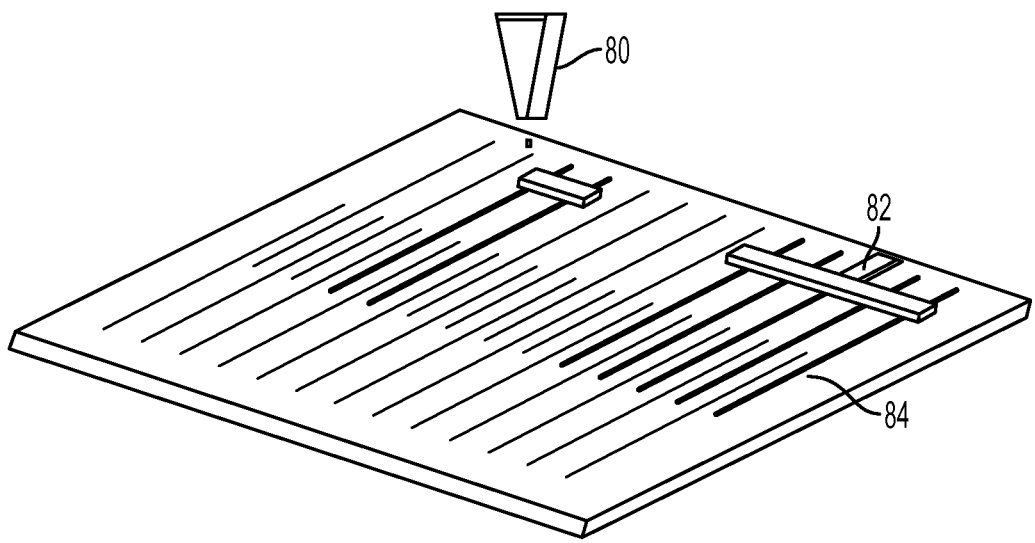
FIG. 12 shows an embodiment of a printing system operable to jet conductive inks over capillary channels.

Other variations exist within the structures of the patterned lines. In one embodiment, shown in FIG. 9, conductive traces such as 70 reside on the surface of the substrate. Metal or indium-tin-oxide deposition followed by imprint lithography may form these lines, or photolithographic patterning and etching. Alternatively, the lines could result from recessed channels such as 72 in FIG. 10. Imprint photolithography or photolithography followed by RIE etching may form these lines. The narrow channels may draw pre-cured conductive ink by capillary force as shown in FIG. 12. In FIG. 12, an ink jet 80 dispenses conductive ink 82 into the channels, which then draws the ink through capillary action to form the lines such as 84.

In yet another embodiment of the parallel lines, they may result from self-assembled monolayers of organic molecules. The process deposits these molecules by stamping or laser patterning. The monolayer controls the surface energy and wetting regions of the solution ink. For example, with aqueous silver, the solution with stay in the hydrophilic region and de-wet away from the hydrophobic region, forming the conductive patterns.

In this manner, ink jetting technology can form smaller electronic devices with faster speeds and the ability to handle higher currents. The pre-patterned substrate has high flexibility and configurability and provides the opportunity for custom manufacturing of electronic circuits and devices at relatively low costs and faster manufacturing times.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A pre-patterned substrate, comprising:
    a supporting material;
    a plurality of segments in direct contact with a surface of the supporting material;
    a plurality of interdigitated parallel, coplanar lines within each segment to allow reconfigurable formation of features, each of the interdigitated lines electrically isolated from the other lines; and
    an isolation region between the segments.

2. The substrate of claim 1, wherein the substrate further comprises a buffer layer.

3. The substrate of claim 1, wherein the supporting material comprises one of plastic, glass, silicon, and steel foil.

4. The substrate of claim 1, wherein the interdigitated lines comprise one of silver, gold, platinum, and aluminum.

5. The substrate of claim 1, wherein the interdigitated lines have a line width in the range of 1 nanometer to 10 micrometers.

6. The substrate of claim 1, wherein the interdigitated lines have a channel length in the range of 1 nanometer to 100 micrometers.

7. The substrate of claim 1, wherein spacing between interdigitated lines within one segment differs from spacing between parallel lines within at least one other segment.

8. The substrate of claim 1, wherein interdigitated lines within one segment may have different channel lengths.

9. The substrate of claim 1, further comprising a floating line in between two lines in a source and drain pair of lines.

10. The substrate of claim 1, wherein the interdigitated lines comprise conductive lines on the substrate.

11. The substrate of claim 1, wherein the interdigitated line structures comprise recessed channels in the substrate.

12. The substrate of claim 1, wherein the interdigitated line structures comprise self-assembled organic molecules.

13. A method, comprising:
   providing a substrate;
   forming interdigitated coplanar, parallel lines in segments in contact with a surface of the substrate, each of the interdigitated lines electrically isolated from the other lines, to allow formation of reconfigurable features; and
   defining isolation regions between the segments in which no interdigitated lines exist.

14. The method of claim 13, wherein forming the interdigitated lines comprises forming conductive traces on a surface of the substrate.

15. The method of claim 13, wherein forming the interdigitated line structures comprises forming recessed channels in the substrate.

16. The method of claim 13, wherein forming the interdigitated line structures comprises depositing molecules of organic molecules, the organic molecules forming self-assembled monolayers.

17. The method of claim 13, further comprising depositing a buffer layer on the substrate prior to forming the interdigitated lines.

18. The method of claim 13, wherein forming the interdigitated lines comprises forming conductive interdigitated lines, the method further comprising:
   depositing semiconductor ink over selected ones of the interdigitated lines;
   conductively connecting a first set of the selected ones of the interdigitated lines that extend beyond the other of the interdigitated lines on one side of the ink together to form a source contact;
   conductively connecting a second set of the selected ones of the interdigitated lines that extend beyond the other of the interdigitated lines on another side of the ink together to form a drain contact; and
   forming a gate contact overlapping the source and drain contacts.

* * * * *